(12) United States Patent
Lin et al.

(10) Patent No.: US 12,232,296 B2
(45) Date of Patent: Feb. 18, 2025

(54) LIQUID COOLING SYSTEM OF CHARGING GUN AND CHARGING GUN

(71) Applicant: Luxshare Precision Industry (Jiangsu) Co., Ltd., Jiangsu (CN)

(72) Inventors: Peiquan Lin, Liyang (CN); Yunbo Linghu, Liyang (CN); Xingran Tang, Liyang (CN); Xiangfeng Shen, Liyang (CN)

(73) Assignee: LUXSHARE PRECISION INDUSTRY (JIANGSU) CO., LTD., Liyang (CN)

( * ) Notice: Subject to any disclaimer, the term of this patent is extended or adjusted under 35 U.S.C. 154(b) by 339 days.

(21) Appl. No.: 17/846,271

(22) Filed: Jun. 22, 2022

(65) Prior Publication Data

US 2023/0130147 A1 Apr. 27, 2023

(30) Foreign Application Priority Data

Oct. 21, 2021 (CN) .......................... 202111228503.0
Oct. 21, 2021 (CN) .......................... 202122538469.9

(51) Int. Cl.
*H05K 7/20* (2006.01)
*H01R 13/04* (2006.01)
(Continued)

(52) U.S. Cl.
CPC ......... *H05K 7/20272* (2013.01); *H01R 13/04* (2013.01); *B60L 53/16* (2019.02); *B60L 53/302* (2019.02); *H01R 2201/26* (2013.01)

(58) Field of Classification Search
CPC ................ H05K 7/20272; H01R 13/04; H01R 2201/26; H01R 13/005; B60L 53/16;
(Continued)

(56) References Cited

U.S. PATENT DOCUMENTS 10,449,871 B1 * 10/2019 Lyon ....................... B60L 53/14
10,644,439 B2 * 5/2020 Fuehrer .................... B60L 1/04
(Continued)

FOREIGN PATENT DOCUMENTS

CN 207416561 U 5/2018
CN 108377633 A 8/2018
(Continued)

*Primary Examiner* — Alexander Gilman
(74) *Attorney, Agent, or Firm* — Birch, Stewart, Kolasch & Birch, LLP (57) ABSTRACT

Provided are a liquid cooling system of a charging gun and a charging gun. The liquid cooling system includes a head cooling assembly, a tail cooling assembly, a liquid input pipe and a liquid output pipe. The head cooling assembly includes a cooling pipe assembly. The cooling pipe assembly is connected to a charging terminal of the charging gun. The tail cooling assembly includes a connection box and a first conductive member. One end of the first conductive member is disposed in the connection box. A cable connected to the charging terminal is connected to the first conductive member in the connection box. Another end of the first conductive member is connected to an external power supply. The liquid input pipe extends through the connection box and communicates with the inlet of the cooling pipe assembly. The liquid output pipe communicates with the outlet of the cooling pipe assembly.

10 Claims, 8 Drawing Sheets

(51) Int. Cl.
*B60L 53/16* (2019.01)
*B60L 53/302* (2019.01)

(58) Field of Classification Search
CPC ........ B60L 53/302; B60L 53/18; Y02T 10/70;
Y02T 10/7072; Y02T 90/12
USPC ........................................................ 439/485
See application file for complete search history.

(56) References Cited

U.S. PATENT DOCUMENTS

| | | | | |
|---|---|---|---|---|
| 11,387,598 | B2* | 7/2022 | Durse | H05K 7/20854 |
| 2003/0077927 | A1* | 4/2003 | Momota | H01R 9/226 |
| | | | | 439/76.2 |
| 2009/0272559 | A1* | 11/2009 | Richter | H02S 40/34 |
| | | | | 174/59 |
| 2013/0069591 | A1* | 3/2013 | Iyasu | H02J 7/0047 |
| | | | | 320/109 |
| 2014/0041826 | A1* | 2/2014 | Takeuchi | B60L 1/08 |
| | | | | 165/10 |
| 2014/0168901 | A1* | 6/2014 | Ide | H01L 23/49575 |
| | | | | 361/717 |
| 2015/0017492 | A1* | 1/2015 | Takeuchi | B60L 58/26 |
| | | | | 429/62 |
| 2015/0047947 | A1* | 2/2015 | Tait | B60L 53/80 |
| | | | | 198/339.1 |
| 2015/0101789 | A1* | 4/2015 | Enomoto | B60H 1/039 |
| | | | | 236/35 |
| 2015/0295285 | A1* | 10/2015 | Takeuchi | B60L 1/02 |
| | | | | 62/498 |
| 2019/0067841 | A1* | 2/2019 | Nagano | H01R 4/34 |
| 2019/0385765 | A1* | 12/2019 | Lyon | H01B 7/423 |
| 2020/0176894 | A1* | 6/2020 | Tomita | B60R 16/0239 |
| 2020/0350098 | A1* | 11/2020 | Neumann | F16L 53/70 |
| 2021/0100138 | A1* | 4/2021 | Chen | H05K 7/20272 |
| 2021/0237599 | A1* | 8/2021 | Müller-Winterberg | |
| | | | | B60L 53/67 |

FOREIGN PATENT DOCUMENTS

| | | |
|---|---|---|
| CN | 208142392 U | 11/2018 |
| CN | 210985044 U | 7/2020 |
| CN | 211556234 U | 9/2020 |
| DE | 10 2018 125 835 A1 | 4/2019 |
| EA | 208376550 U | 1/2019 |
| WO | WO 2020/239145 A2 | 12/2020 |

* cited by examiner

LIQUID COOLING SYSTEM OF CHARGING GUN AND CHARGING GUN

CROSS-REFERENCE TO RELATED APPLICATION(S)

This application claims priority to Chinese Patent Application No. 202111228503.0 filed Oct. 21, 2021, and Chinese Patent Application No. 202122538469.9 filed Oct. 21, 2021, the disclosures of which are incorporated herein by reference in their entireties.

TECHNICAL FIELD

The present disclosure relates to the field of direct current fast charging technology and, in particular, to a liquid cooling system of a charging gun and a charging gun.

BACKGROUND

With the popularity of new energy electric vehicles, the development of direct current fast charging technology becomes more and more important. A direct-current charging gun is an important component of the direct current fast charging technology, and there have been many mature direct-current charging gun products on the market. To improve the charging speed, shorten the charging time and improve the user experience, the charging current and the power that the direct-current charging gun use to charge a load are inevitably being greater.

However, in the charging process, a large amount of heat is generated on a charging terminal and the joint between a cable and an external power supply. Thus, the charging efficiency is reduced, great damage is caused to the charging gun, and even a fire appears.

SUMMARY

An object of the present disclosure is to provide a liquid cooling system of a charging gun and a charging gun to reduce the temperature at a charging terminal and a joint to avoid a fire.

To achieve the preceding object, the present disclosure adopts the solution below.

In one aspect, the present disclosure provides a liquid cooling system of a charging gun. The liquid cooling system of the charging gun includes a head cooling assembly, a tail cooling assembly, a liquid input pipe and a liquid output pipe.

The head cooling assembly includes a cooling pipe assembly. The cooling pipe assembly is connected to a charging terminal of the charging gun.

The tail cooling assembly includes a connection box and a first conductive member. One end of the first conductive member is disposed in the connection box. A cable connected to the charging terminal is connected to the first conductive member in the connection box. Another end of the first conductive member is connected to an external power supply.

The liquid input pipe extends through the connection box and is in communication with the inlet of the cooling pipe assembly. The liquid output pipe is in communication with the outlet of the cooling pipe assembly.

In another aspect, the present disclosure further provides a charging gun. The charging gun includes the above liquid cooling system of the charging gun.

REFERENCE LIST 100 charging terminal
101 cooling groove
102 inlet channel
103 outlet channel
200 cable
201 second conductive member
1 head cooling assembly
11 cooling pipe assembly
111 elongate cooling pipe
112 water inlet cooling pipe
113 water outlet cooling pipe
114 diverter member
115 first blocking member
116 second blocking member
12 pipe joint
2 tail cooling assembly
21 connection box
201 first channel
202 second channel
203 third channel
211 box body
2111 first lower avoidance groove
21111 first lower sealing groove
2112 second lower avoidance groove
21121 second lower sealing groove
2113 third lower avoidance groove
21131 third lower sealing groove
2114 lower installation groove
2115 connection member
212 cover
2121 first upper avoidance groove
21211 first upper sealing groove
2122 second upper avoidance groove
21221 second upper sealing groove 2123 protrusion
21231 third upper sealing groove
2124 pour hole
2125 upper installation groove
2126 positioning member
213 first sealing member
214 second sealing member
215 third sealing member
216 sealing ring
22 first conductive member
221 connection hole
3 liquid input pipe
4 liquid output pipe
5 three-way pipe
6 input adapter
7 output adapter

DETAILED DESCRIPTION

The solution of the present disclosure is described clearly and completely below in conjunction with drawings. Apparently, the described embodiments are part, not all, of embodiments of the present disclosure. Based on the embodiments of the present disclosure, all other embodiments obtained by those of ordinary skill in the art without creative work are within the scope of the present disclosure.

In the description of the present disclosure, it is to be noted that orientations or position relations indicated by terms such as "center", "upper", "lower", "left", "right", "vertical", "horizontal", "in", and "out" are based on the drawings. These orientations or position relations are intended only to facilitate and simplify the description of the present disclosure and not to indicate or imply that a device or element referred to must have such particular orientations or must be configured or operated in such particular orientations. Thus, these orientations or position relations are not to be construed as limiting the present disclosure. In addition, terms such as "first" and "second" are used only for the purpose of description and are not to be construed as indicating or implying relative importance. The terms "first position" and "second position" are two different positions. Moreover, when the first feature is described as "on", "above", or "over" the second feature, the first feature is right on, above, or over the second feature or the first feature is obliquely on, above, or over the second feature, or the first feature is simply at a higher level than the second feature. When the first feature is described as "under", "below" or "underneath" the second feature, the first feature is right under, below or underneath the second feature or the first feature is obliquely under, below or underneath the second feature, or the first feature is simply at a lower level than the second feature.

In the description of the present disclosure, it is to be noted that unless otherwise expressly specified and limited, the term "mounted", "connected to each other", or "connected" should be construed in a broad sense as securely connected, detachably connected, or integrally connected; mechanically connected or electrically connected; directly connected to each other or indirectly connected to each other via an intermediary; or intraconnected between two components. For those of ordinary skill in the art, specific meanings of the preceding terms in the present disclosure may be understood based on specific situations.

The embodiments of the present disclosure are described in detail below, and examples of the embodiments are illustrated in the drawings, where the same or similar reference numerals indicate the same or similar elements or elements having the same or similar functions. The embodiments described below with reference to the drawings are merely exemplary and intended to explain the present disclosure, and are not to be construed as limiting the present disclosure.

Embodiment One

As shown in FIGS. 1 to 10, this embodiment provides a liquid cooling system of a charging gun. The liquid cooling system of the charging gun includes a head cooling assembly 1, a tail cooling assembly 2, a liquid input pipe 3 and a liquid output pipe 4. The head cooling assembly 1 includes a cooling pipe assembly 11. The cooling pipe assembly 11 is connected to a charging terminal 100 of a charging gun. The tail cooling assembly 2 includes a connection box 21 and a first conductive member 22. One end of the first conductive member 22 is disposed in the connection box 21. A cable 200 connected to the charging terminal 100 is connected to the first conductive member 22 in the connection box 21. Another end of the first conductive member 22 is connected to an external power supply. In this manner, the charging terminal 100 is electrically connected to a charging pile. The liquid input pipe 3 extends through the connection box 21 and communicates with the inlet of the cooling pipe assembly 11. The liquid output pipe 4 communicates with the outlet of the cooling pipe assembly 11.

In this embodiment, with this arrangement, heat generated on the connection terminal between the cable 200 and the external power supply and heat generated on the charging terminal. In this manner, the temperature at the joint of the cable 200 and the temperature at the charging terminal 100 can be reduced. Thus, the charging efficiency can be improved, and the charging risk can be reduced.

Figure 4:
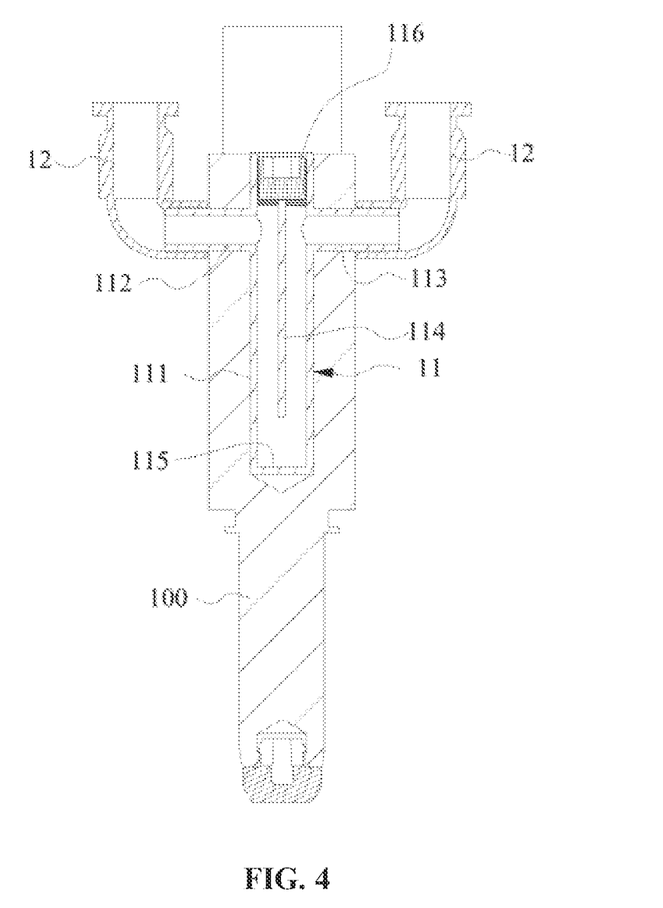
FIG. 4 is a view illustrating the structure of a charging terminal and a cooling pipe assembly according to an embodiment of the present disclosure.
Figure 5:
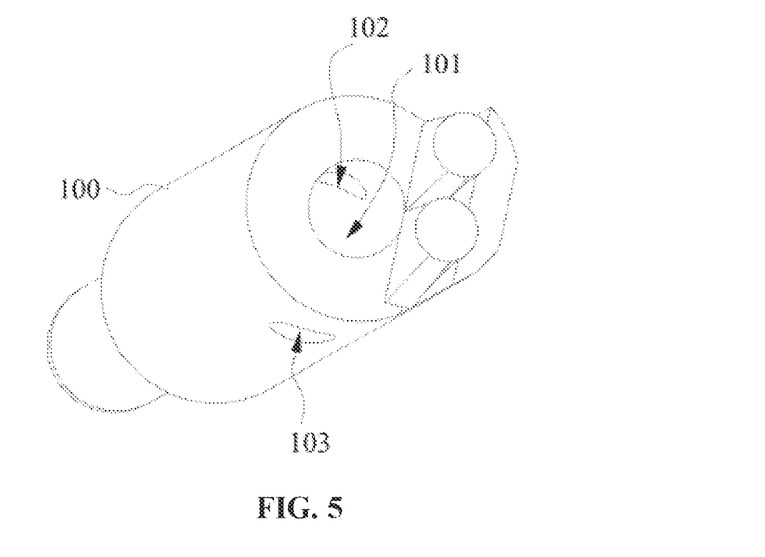
FIG. 5 is a view illustrating the structure of the charging terminal according to an embodiment of the present disclosure.

In an embodiment, the charging terminal 100 is provided with a cooling groove 101. The cooling pipe assembly 11 is inserted in the cooling groove 101. With this arrangement, the heat of the charging terminal 100 from the inside of the charging terminal 100 without affecting the external structure of the charging terminal 100 can be taken away. Therefore, there is no need to improve the design of the external structure of the charging terminal 100. Further, the improved design of the charging interface matched with the charging terminal 100 is avoided. In this manner, the cost of technology improvement is reduced. In addition, the cooling pipe assembly 11 is provided in the cooling groove 101 to protect the cooling pipe assembly 11 from damage.

In this embodiment, the cooling groove 101 is in a long strip shape. The extension direction of the cooling groove 101 is consistent with the extension direction of the charging terminal 100. The opening of the cooling groove 101 is disposed at the wiring terminal of the charging terminal 100. The cooling pipe assembly includes an elongate cooling pipe 111. The elongate cooling pipe 111 is inserted in the cooling groove 101. The insertion efficiency of the cooling pipe assembly 11 and the cooling groove 101 is facilitated by the preceding arrangement.

Further, the sidewall of the charging terminal 100 is provided with an outlet channel 103 and an inlet channel 102 that communicate with the cooling groove 101. The cooling pipe assembly 11 also includes a water inlet cooling pipe 112 and a water outlet cooling pipe 113. One end of the water inlet cooling pipe 112 extends into the inlet channel 102 and communicates with the elongate cooling pipe 111. Another end of the water inlet cooling pipe 112 communicates with the liquid input pipe 3. One end of the water outlet cooling pipe 113 extends into the outlet channel 103 and communicates with the elongate cooling pipe 111. Another end of the water outlet cooling pipe 113 communicates with the liquid output pipe 4. On one hand, with this arrangement, the elongate cooling pipe 111 in the cooling groove 101 through the water inlet cooling pipe 112 and the water outlet cooling pipe 113 can be engaged. On the other hand, this arrangement also facilitates the connection of the liquid input pipe 3 and the liquid output pipe 4. In an embodiment, the water inlet cooling pipe 112 and the water outlet cooling pipe 113 may be screwed, welded or integrally formed with the elongate cooling pipe 111.

In an embodiment, the cooling pipe assembly 11 also includes a diverter member 114. The diverter member 114 is disposed in the elongate cooling pipe 111 and between the water inlet cooling pipe 112 and the water outlet cooling pipe 113. The liquid in the water inlet cooling pipe 112 bypasses the diverter member 114 in the elongate cooling pipe 111 and then enters the water outlet cooling pipe 113. The arrangement of the diverter member 114 can prolong the flow path of the cooling liquid in the elongate cooling pipe 111. In this manner, the contact area between the flowing liquid and the elongate cooling pipe 111 can be expanded. Therefore, the cooling effect on the charging terminal 100 can be improved.

In an embodiment, the cooling pipe assembly 11 also includes a first blocking member 115 and a second blocking member 116. Two ends of the elongate cooling pipe 111 are blocked by the first blocking member 115 and the second blocking member 116 respectively. This arrangement enables the elongate cooling pipe 111 to be in a long cylindrical shape. Thus, the production efficiency can be improved, and the production cost can be reduced.

With regard to the installation mode of the diverter member 114, in an embodiment, the inner wall of the cooling long pipe 111 is provided with two strip-shaped grooves opposite to each other. The diverter member 114 includes a diverter plate. Two sides of the diverter plate are inserted in the two strip-shaped grooves respectively. One end of the diverter plate facing away from the bottom of the cooling groove 101 is abutted against the second blocking member 116; and another end of the diverter plate is spaced from the first blocking member 115. This arrangement makes the flow path of the liquid in the long cooling tube 111 the longest.

In an embodiment, the first blocking member 115 is integrally formed with the elongate cooling pipe 111, and the second blocking member 116 is screwed or engages with the elongate cooling pipe 111. In an embodiment, one end of the elongate cooling pipe 111 facing away from the bottom of the cooling groove 101 is provided with an internal thread. The second blocking member 116 includes a stud. The stud is screwed to the elongate cooling pipe 111 and is abutted against the diverter plate. In an embodiment, a sealing gasket is disposed between the stud and the diverter plate. The sealing gasket is preferably a rubber gasket.

Of course, in other implementations of this embodiment, the cooling pipe assembly 11 may also be disposed on the outside of the charging terminal 100. For example, an annular groove is disposed on the periphery of the charging terminal 100, and the annular groove sleeves the cooling pipe assembly 11.

Figure 3:
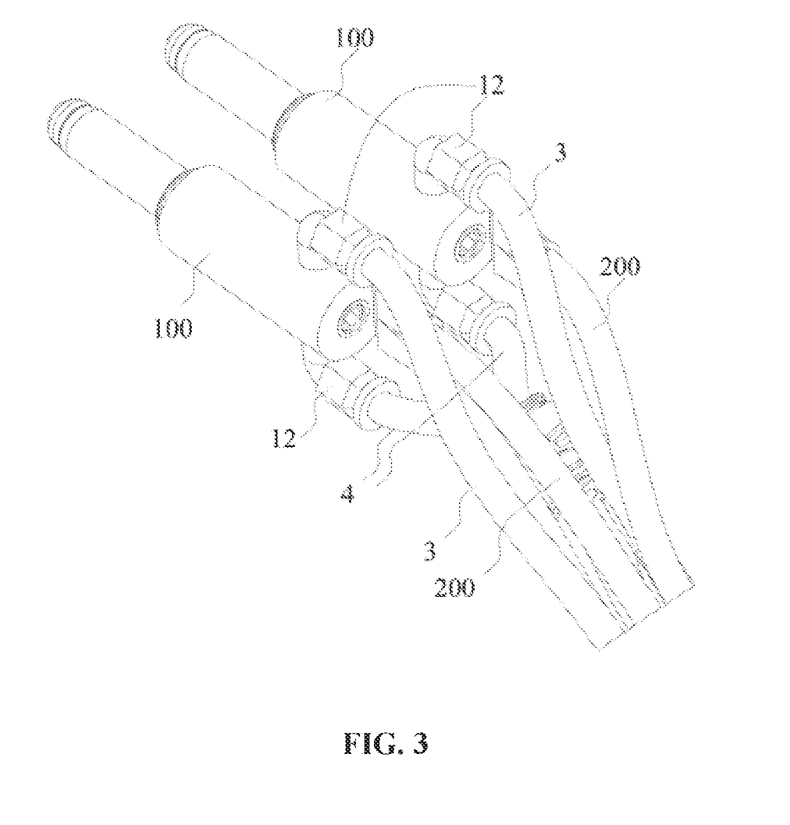
FIG. 3 is a view illustrating the structure of the head cooling assembly according to an embodiment of the present disclosure.

The head cooling assembly 1 also includes a pipe joint 12. The water inlet cooling pipe 112 communicates with the liquid input pipe 3 through a pipe joint 12. The water outlet cooling pipe 113 communicates with the liquid output pipe 4 through a pipe joint 12. This arrangement can improve the connection efficiency between the water inlet cooling pipe 112 and the liquid input pipe 3 and the connection efficiency between the water outlet cooling pipe 113 and the liquid output pipe 4. Moreover, the damaged pipe joint 12 may be replaced individually. Therefore, the operating frequency of the water inlet cooling pipe 112 and the operating frequency of the water outlet cooling pipe 113 are reduced. In this manner, the service life of the water inlet cooling pipe 112 and the service life of the water outlet cooling pipe 113 are improved.

With regard to the structure of the connection box 21, in an embodiment, the connection box 21 includes a box body 211 and a cover 212. The box body 211 is provided with a first lower avoidance groove 2111 and a second lower avoidance groove 2112. The cover 212 is provided with a first upper avoidance groove 2121 and a second upper avoidance groove 2122. After the box body 211 and the cover 212 are fastened, the box body 211 and the cover 212 form an installation chamber. The first lower avoidance groove 2111 and the first upper avoidance groove 2121 form a first channel 201. The second lower avoidance groove 2112 and the second upper avoidance groove 2122 form a second channel 202. The cable 200 extends through the first channel 201 and then into the installation chamber. The liquid input pipe 3 extends through the second channel, into the installation chamber and then out of the first channel 201. This arrangement of the preceding structure facilitates the installation of the cable 200 and the liquid input pipe 3 and facilitates the maintenance after the cable 200 and the liquid input pipe 3 are detached from the connection box 21.

Figure 9:
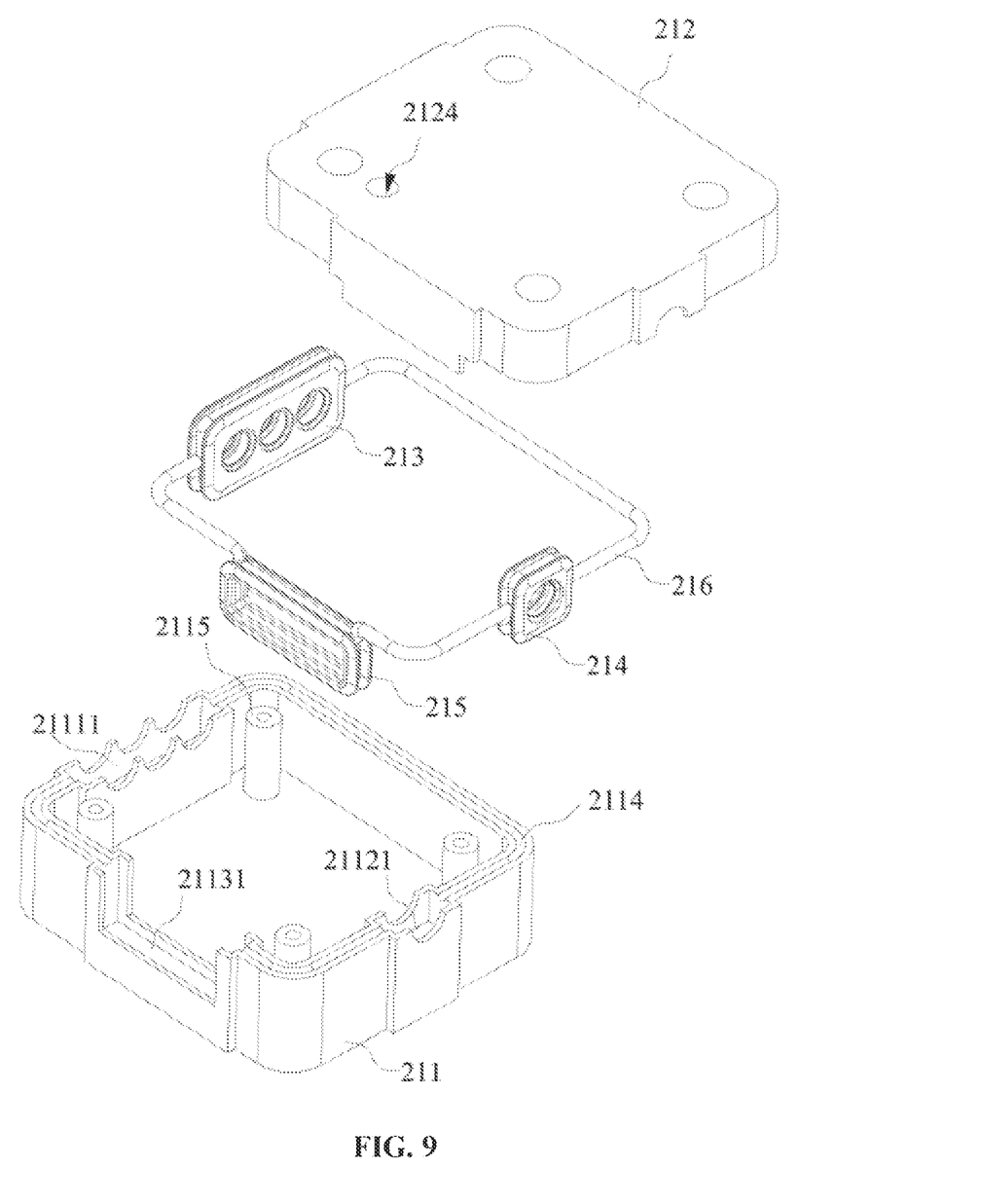
FIG. 9 is an exploded view illustrating the structure of the connection box according to an embodiment of the present disclosure.
Figure 10:
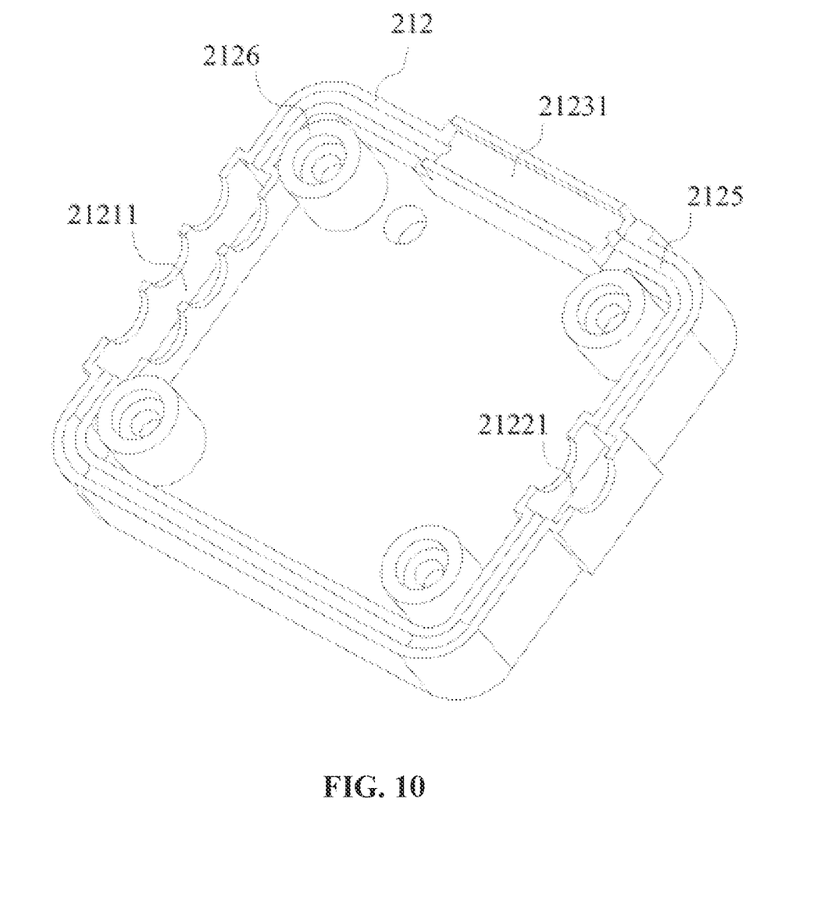
FIG. 10 is a view illustrating the structure of a cover according to an embodiment of the present disclosure.

In an embodiment, one of the box body 211 or the cover 212 is provided with a third lower avoidance groove 2113, and another one of the box body or the cover is provided with a protrusion 2123. In an embodiment, the box body 211 is provided with the third lower avoidance groove 2113, and the cover 212 is provided with the protrusion 2123. After the box body 211 and the cover 212 are fastened, the protrusion 2123 engages with the third lower avoidance groove 2113, and the protrusion 2123, the third lower avoidance groove 2113, the box body 211 and the cover 212 form a third channel 203. The height of the third channel 203 is lower than the height of the first channel 201. Part of the first conductive member 22 extends through the third channel 203. This arrangement ensures that the position of the first conductive member 22 in the third channel 203 does not stop the liquid input pipe 3 to facilitate the arrangement of the liquid input pipe 3. In an embodiment, the liquid input pipe 3 fits against one side of the first conductive member 22. In an embodiment, the part of the liquid input pipe 3 in contact with the first conductive member 22 is a flat structure. Therefore, the contact area between the liquid input pipe 3 and the first conductive member 22 is improved. In this manner, the cooling effect on the first conductive member 22 is improved. Optionally, the first conductive member 22 is a copper sheet.

Figure 1:
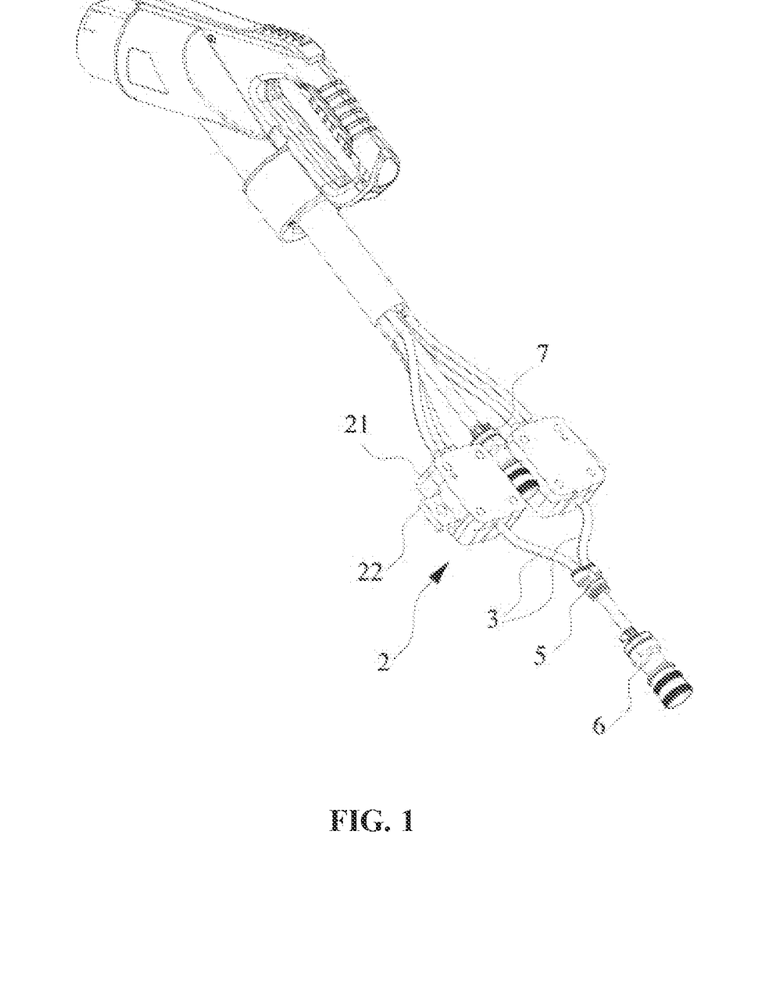
FIG. 1 is a view illustrating the structure of a charging gun according to an embodiment of the present disclosure.
Figure 2:
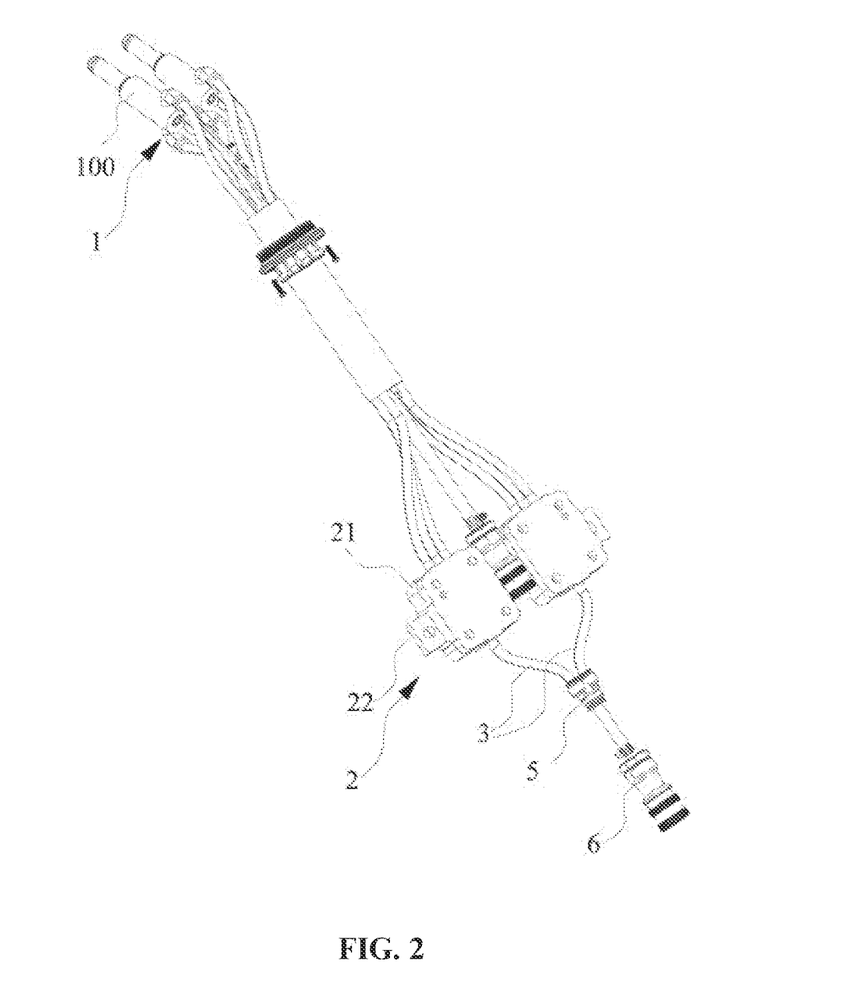
FIG. 2 is a view illustrating the structure of a head cooling assembly and a tail cooling assembly according to an embodiment of the present disclosure.

In an embodiment, each charging terminal 100 is provided with one cooling pipe assembly 11 and one liquid input pipe 3, and each first conductive member 22 is provided with one connection box 21. This arrangement ensures that the heat generated by each charging terminal 100 can be taken away by the cooling pipe assembly 11, and the heat generated by the joint of the cable 200 can also be taken away by the cooling pipe assembly 11.

The connection box 21 also includes a first sealing member 213, a second sealing member 214 and a third sealing member 215. The first sealing member 213, the second sealing member 214 and the third sealing member 215 are used to seal the first channel 201, the second channel 202 and the third channel 203 respectively. This arrangement can improve the sealing effect of the first channel 201, the second channel 202 and the third channel 203.

In this embodiment, a first lower sealing groove 21111 is disposed at the groove bottom and the groove walls on two sides of the first lower avoiding groove 2111. A first upper sealing groove 21211 is disposed at the groove bottom and the groove walls on two sides of the first upper avoiding groove 2121. A second lower sealing groove 21121 is disposed at the groove bottom and the groove walls on two sides of the second lower avoiding groove 2112. A second upper sealing groove 21221 is disposed at the groove bottom and the groove walls on two sides of the second upper avoiding groove 2122. A third lower sealing groove 21131 is disposed at the groove bottom and the groove walls on two sides of the third lower avoiding groove 2113. A third upper sealing groove 21231 is disposed at one end of the protrusion 2123 facing the groove bottom of the third lower avoidance groove 2113. After the cover 212 covers the box body 211, the first lower sealing groove 21111 and the first upper sealing groove 21211 form a first sealing chamber; the second lower sealing groove 21121 and the second upper sealing groove 21221 form a second sealing chamber; and the third lower sealing groove 21131 and the first upper sealing groove 21231 form a third sealing chamber. The first sealing member 213, the second sealing member 214 and the third sealing member 215 are installed in the first sealing chamber, the second sealing chamber and the third sealing chamber respectively.

Further, the connection box 21 also includes a sealing ring 216. A lower installation groove 2114 is disposed on the side of the box body 211 where the box body 211 contacts the cover 212. An upper installation groove 2125 is disposed on the side of the cover 212 where the cover 212 contacts the box body 211. When the cover 212 covers the box body 211, the lower installation groove 2114 and the upper installation groove 2125 form an annular channel. The annular channel sequentially communicates with the first channel 201, the second channel 202 and the third channel 203. The sealing ring 216 is embedded in the annular channel.

Further, a first annular installation groove is disposed in the circumferential direction of the first sealing member 213. A second annular installation groove is disposed in the circumferential direction of the second sealing member 214. A third annular installation groove is disposed in the circumferential direction of the third sealing member 215. This arrangement ensures that the sealing ring 216 can be embedded in the first annular installation groove, the second annular installation groove and the third annular installation groove at the first channel 201, the second channel 202 and the third channel 203 respectively. The preceding arrangement further ensures the sealing property of the installation chamber.

Figure 6:
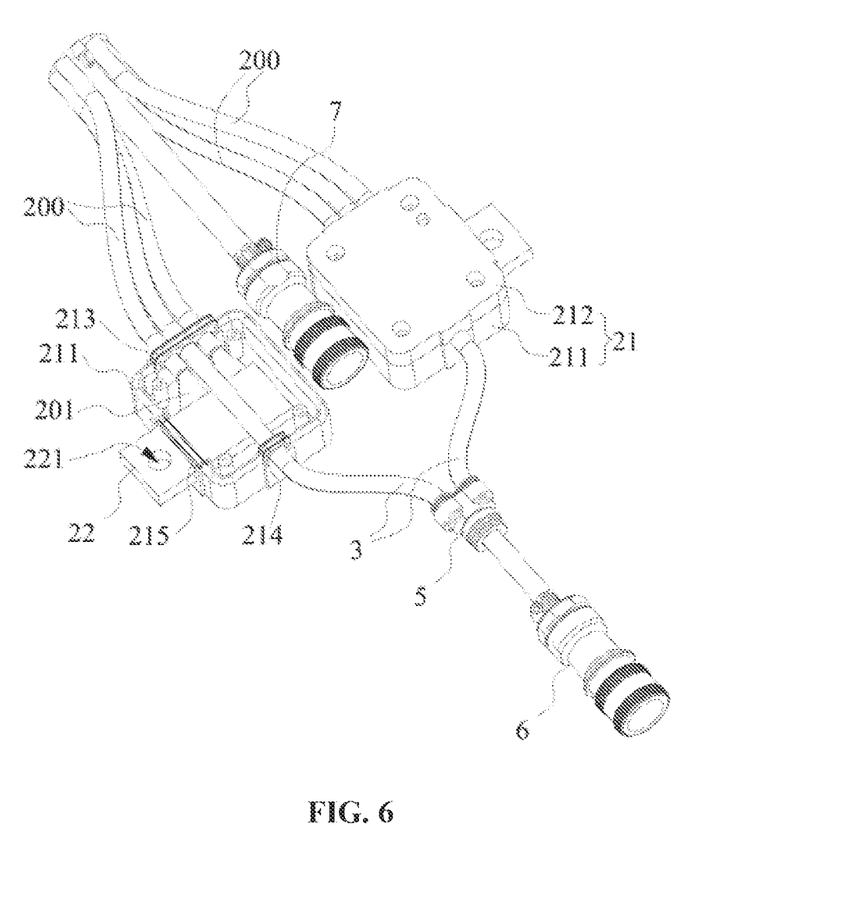
FIG. 6 is a view illustrating the structure of the tail cooling assembly according to an embodiment of the present disclosure.
Figure 7:
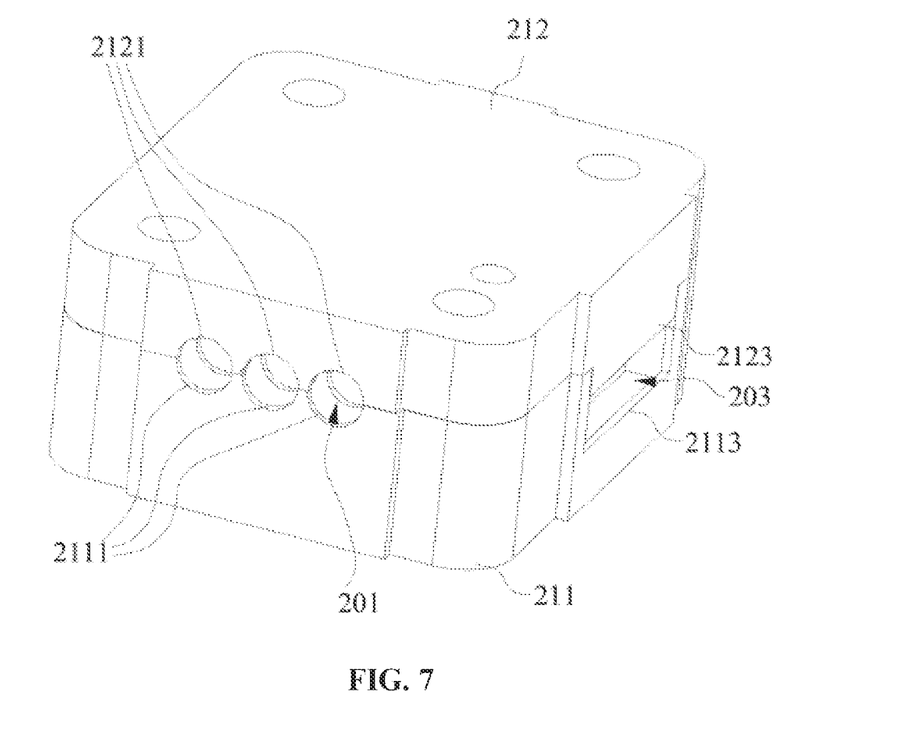
FIG. 7 is view one illustrating the structure of a connection box according to an embodiment of the present disclosure.
Figure 8:
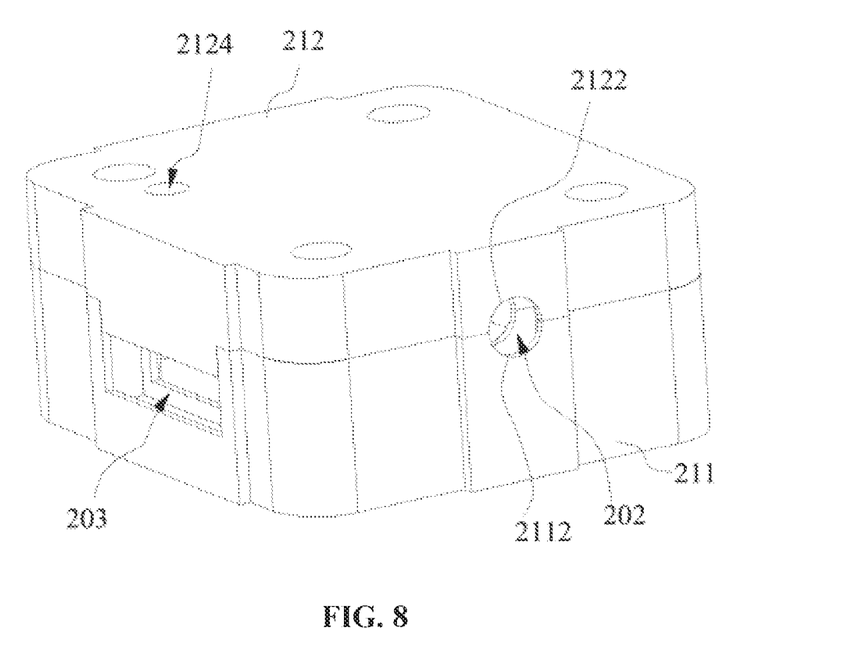
FIG. 8 is view two illustrating the structure of the connection box according to an embodiment of the present disclosure.

In an embodiment, another end of the first conductive member 22 is provided with a connection hole 221. The first conductive member 22 is connected to the external power supply through the connection hole 221. This arrangement facilitates the wire of the external power supply to be tied to the first conductive member 22 after the wire extends through the connection hole 221, so that the connection is more firm.

In an embodiment, the liquid cooling system of the charging gun also includes a second conductive member 201. One end of the second conductive member 201 is connected to the cable 200. Another end of the second conductive member 201 is connected to the first conductive member 22. In an embodiment, the second conductive member 201 may be welded with the cable 200 or be connected to the cable 200 in a hot-melt manner, and it is not limited thereto. Preferably, the second conductive member 201 may be welded with the first conductive member 22 or be connected to the first conductive member 22 in a hot-melt manner, and it is not limited thereto.

In an embodiment, the cover 212 is provided with a pour hole 2124. Glue can be poured into the installation chamber from the pour hole 2124 to seal the connection between the cable 200 and the second conductive member 201 and the connection between the second conductive member 201 and the first conductive member 22. In this manner, the waterproof function, the moisture-proof function and the shockproof function can be achieved.

In an embodiment, the box body 211 and the cover 212 body are connected by a screw. In an embodiment, the box body 211 is provided with a connection member 2115. The cover 212 is provided with a positioning member 2126. The positioning member 2126 is provided with a positioning groove. When the cover 212 covers the box body 211, the connection member 2115 can be inserted in the positioning groove, and the screw extends through the positioning member 2126 and is screwed to the connection member 2115.

In practice, two charging terminals 100 are generally disposed, corresponding to the positive and negative electrodes of the power supply respectively. In this embodiment, to implement the cooling of the two charging terminals 100, for example, two head cooling assembly 1 are disposed, and the two charging terminals 100 are cooled by two liquid input pipes 3 and two liquid output pipes 4 respectively; and two tail cooling assembly 2 are disposed, and two first conductive members 22 are cooled by the two liquid input pipes 3 respectively.

To optimize the arranged paths of the pipes and reduce the number of the pipes, in this embodiment, for example, the liquid cooling system of the charging gun also includes a three-way pipe 5, an input adapter 6 and an output adapter 7. The two liquid input pipes 3 communicate with the input adapter 6 through a three-way pipe 5. The two liquid output pipes 4 communicate with the output adapter 7 through another three-way pipe 5. This arrangement can reduce the number of the pipes and make compact the structure of the whole liquid cooling system of the charging gun. Therefore, the cost can be reduced.

In an embodiment, each charging terminal 100 is connected to two parallel cables 200. This arrangement ensures that the function of the charging terminal 100 is not affected in the case where one cable 200 is damaged. Therefore, the anti-risk capacity of the apparatus can be improved. In this embodiment, three first channels 201 are disposed. Two cables 200 of each charging terminal 100 extend through the first channels 201 on two sides. The liquid input pipe 3 extends through the first channel 201 in the middle.

Further, two cables 200 connected to the same charging terminal 100 are clamped on two sides of one liquid input pipe 3. With this arrangement, the cable 200 can also be cooled all the time. The material of the liquid input pipe 3 is copper.

Embodiment Two

This embodiment provides a charging gun. The charging gun includes the liquid cooling system of the charging gun in any of the preceding solutions.

Apparently, the preceding embodiments of the present disclosure are only illustrative of the present disclosure and are not intended to limit the implementations of the present disclosure. For those of ordinary skill in the art, changes or alterations in other different forms may also be made based on the preceding description. Implementations of the present disclosure cannot be and do not need to be all exhausted herein. Any modifications, equivalent substitutions, and improvements made within the spirit and principle of the present disclosure fall within the scope of the claims of the present disclosure.

What is claimed is:

1. A liquid cooling system of a charging gun, comprising:
a head cooling assembly comprising a cooling pipe assembly connected to a charging terminal of the charging gun;
a tail cooling assembly comprising a connection box and a first conductive member, wherein one end of the first conductive member is disposed in the connection box, a cable connected to the charging terminal is connected to the first conductive member in the connection box, and another end of the first conductive member is connected to an external power supply; and
a liquid input pipe and a liquid output pipe, wherein the liquid input pipe extends through the connection box and is in communication with an inlet of the cooling pipe assembly, and the liquid output pipe is in communication with an outlet of the cooling pipe assembly,
wherein the charging terminal is provided with a cooling groove, and the cooling pipe assembly is inserted in the cooling groove;
wherein an extension direction of the cooling groove is consistent with an extension direction of the charging terminal, an opening of the cooling groove is disposed at a wiring terminal of the charging terminal, the cooling pipe assembly comprises an elongate cooling pipe, and the elongate cooling pipe is inserted in the cooling groove;
wherein a sidewall of the charging terminal is provided with an outlet channel and an inlet channel that are in communication with the cooling groove, and the cooling pipe assembly further comprises a water inlet cooling pipe and a water outlet cooling pipe, wherein one end of the water inlet cooling pipe extends into the inlet channel and is in communication with the elongate cooling pipe, another end of the water inlet cooling pipe is in communication with the liquid input pipe, one end of the water outlet cooling pipe extends into the outlet channel and is in communication with the elongate cooling pipe, and another end of the water outlet cooling pipe is in communication with the liquid output pipe; and
wherein the cooling pipe assembly further comprises a diverter member, the diverter member is disposed in the elongate cooling pipe and between the water inlet cooling pipe and the water outlet cooling pipe, and the diverter member is configured to allow a liquid in the water inlet cooling pipe to bypass the diverter member in the elongate cooling pipe and then enter the water outlet cooling pipe.

2. The liquid cooling system of the charging gun according to claim 1, wherein the cooling pipe assembly further comprises a first blocking member and a second blocking member, and two ends of the elongate cooling pipe are blocked by the first blocking member and the second blocking member, respectively.

3. The liquid cooling system of the charging gun according to claim 2, wherein the connection box comprises a box body and a cover, wherein the box body is provided with a first lower avoidance groove and a second lower avoidance groove, and the cover is provided with a first upper avoidance groove and a second upper avoidance groove, wherein
after the box body and the cover are fastened, the box body and the cover form an installation chamber, the first lower avoidance groove and the first upper avoidance groove form a first channel, the second lower avoidance groove and the second upper avoidance groove form a second channel, the cable extends through the first channel and then into the installation chamber, and the liquid input pipe extends through the second channel, into the installation chamber and then out of the first channel.

4. The liquid cooling system of the charging gun according to claim 1, wherein the connection box comprises a box body and a cover, wherein the box body is provided with a first lower avoidance groove and a second lower avoidance groove, and the cover is provided with a first upper avoidance groove and a second upper avoidance groove, wherein
after the box body and the cover are fastened, the box body and the cover form an installation chamber, the first lower avoidance groove and the first upper avoidance groove form a first channel, the second lower avoidance groove and the second upper avoidance groove form a second channel, the cable extends through the first channel and then into the installation chamber, and the liquid input pipe extends through the second channel, into the installation chamber and then out of the first channel.

5. The liquid cooling system of the charging gun according to claim 4, wherein one of the box body or the cover is provided with a third lower avoidance groove, and another one of the box body or the cover is provided with a protrusion, wherein
after the box body and the cover are fastened, the protrusion engages with the third lower avoidance groove, and the protrusion, the third lower avoidance groove, the box body and the cover form a third channel, wherein a height of the third channel is lower than a height of the first channel, and the first conductive member partially extends through the third channel.

6. The liquid cooling system of the charging gun according to claim 1, wherein the another end of the first conductive member is provided with a connection hole, and the first conductive member is connected to the external power supply through the connection hole.

7. The liquid cooling system of the charging gun according to claim 6, further comprising a second conductive member, wherein one end of the second conductive member is connected to the cable, and another end of the second conductive member is connected to the first conductive member.

8. The liquid cooling system of the charging gun according to claim 1, further comprising a second conductive member, wherein one end of the second conductive member is connected to the cable, and another end of the second conductive member is connected to the first conductive member.

9. The liquid cooling system of the charging gun according to claim 1, wherein each charging terminal is provided with one cooling pipe assembly and one liquid input pipe, and each first conductive member is provided with one connection box.

10. A charging gun, comprising a liquid cooling system of a charging gun, wherein the liquid cooling system of the charging gun comprises:

a head cooling assembly comprising a cooling pipe assembly connected to a charging terminal of the charging gun;

a tail cooling assembly comprising a connection box and a first conductive member, wherein one end of the first conductive member is disposed in the connection box, a cable connected to the charging terminal is connected to the first conductive member in the connection box, and another end of the first conductive member is connected to an external power supply; and a liquid input pipe and a liquid output pipe, wherein the liquid input pipe extends through the connection box and is in communication with an inlet of the cooling pipe assembly, and the liquid output pipe is in communication with an outlet of the cooling pipe assembly, wherein the charging terminal is provided with a cooling groove, and the cooling pipe assembly is inserted in the cooling groove;

wherein an extension direction of the cooling groove is consistent with an extension direction of the charging terminal, an opening of the cooling groove is disposed at a wiring terminal of the charging terminal, the cooling pipe assembly comprises an elongate cooling pipe, and the elongate cooling pipe is inserted in the cooling groove;

wherein a sidewall of the charging terminal is provided with an outlet channel and an inlet channel that are in communication with the cooling groove, and the cooling pipe assembly further comprises a water inlet cooling pipe and a water outlet cooling pipe, wherein one end of the water inlet cooling pipe extends into the inlet channel and is in communication with the elongate cooling pipe, another end of the water inlet cooling pipe is in communication with the liquid input pipe, one end of the water outlet cooling pipe extends into the outlet channel and is in communication with the elongate cooling pipe, and another end of the water outlet cooling pipe is in communication with the liquid output pipe; and wherein the cooling pipe assembly further comprises a diverter member, the diverter member is disposed in the elongate cooling pipe and between the water inlet cooling pipe and the water outlet cooling pipe, and the diverter member is configured to allow a liquid in the water inlet cooling pipe to bypass the diverter member in the elongate cooling pipe and then enter the water outlet cooling pipe.

* * * * *